United States Patent
Kawai

(10) Patent No.: US 6,836,199 B2
(45) Date of Patent: Dec. 28, 2004

(54) TUNING CIRCUIT

(75) Inventor: Kazuo Kawai, Tokyo (JP)

(73) Assignee: General Research of Electronics, Inc., Tokyo (JP)

( * ) Notice: Subject to any disclaimer, the term of this patent is extended or adjusted under 35 U.S.C. 154(b) by 27 days.

(21) Appl. No.: 10/454,724

(22) Filed: Jun. 4, 2003

(65) Prior Publication Data

US 2004/0017273 A1 Jan. 29, 2004

(30) Foreign Application Priority Data

Jul. 26, 2002 (JP) .......................... 2002-218036

(51) Int. Cl.⁷ .............................................. H03H 11/00

(52) U.S. Cl. ........................................ 333/214; 333/216

(58) Field of Search ................................ 333/214, 213, 333/216, 217

(56) References Cited

U.S. PATENT DOCUMENTS 6,545,570 B2 * 4/2003 Kawai ........................ 333/216

* cited by examiner

Primary Examiner—Michael Tokar
Assistant Examiner—Joseph Lauture
(74) Attorney, Agent, or Firm—Flynn, Thiel Boutell & Tanis, P.C.

(57) ABSTRACT

In order to improve Q of a tuning circuit by using a negative resistance circuit, a tuning circuit wherein a frequency selectivity characteristic and a tuning circuit gain does not vary and are kept constant values even if a tuning frequency is changed, is provided. The tuning circuit is constructed so as to compensate a series resistance component by connecting a negative resistance circuit to a series resonance circuit. The negative resistance circuit includes a differential amplifying circuit having two transistors emitters of which are connected in common, and a low output impedance circuit such as an emitter follower. The low impedance output is fed back to a same phase input side of the differential amplifying circuit directly and also to an inverse phase input side thereof to obtain a negative resistance value at this inverse input terminal.

2 Claims, 3 Drawing Sheets

TUNING CIRCUIT

BACKGROUND OF THE INVENTION

1. Field of the Invention

The present invention relates to an improvement of a tuning circuit using a negative resistance circuit in order to improve Q of the tuning circuit.

2. Description of the Related Art

In a radio receiver, in order to improve frequency selectivity of a high frequency section thereof, there are methods to add a tuning amplifying section thereto or to use a negative resistance circuit. Further, the latter method contains a so-called reproduce receiving method wherein positive feedback is applied from an output of an amplifier to a tuning circuit section and a method to improve effective Q of a tuning circuit by adding a negative resistance circuit including a negative impedance converter, etc. to a tuning circuit. However, in the positive feedback method, since it is necessary to keep a circuit always in oscillatable condition even if a tuning frequency is changed, this is not easy. Also, in the method using the negative resistance circuit, circuit construction for it is simple and operates stably in a high frequency band and setting of negative resistance value is simple but a negative resistance circuit having such circuit construction is unknown.

SUMMARY OF THE INVENTION

An object of the present invention is to provide a tuning circuit using a negative resistance circuit wherein path band width and circuit gain are constant and it is easy to set a negative resistance value even if a tuning frequency is changed, and circuit construction of the negative resistance circuit is simple.

In order to attain the above object the present invention provides a tuning circuit comprising a series resonance circuit, a driving circuit connected to one side of the series resonance circuit and a negative resonance circuit connected to other side of the series resonance circuit, said negative resistance circuit consisting of a differential amplifying circuit connected to the series resonance circuit and a low output impedance circuit connected to the differential amplifying circuit, an output of the low output impedance circuit being fed back directly to a same phase input side of the differential amplifying circuit and to an inverse phase side thereof through a negative resistance value setting resistor, and a tuned output signal being taken out from a same phase output side of the differential amplifying circuit.

In the present invention, said differential amplifying circuit may include two transistors emitters of which are connected with each other in common and the low output impedance circuit may be an emitter follower circuit.

DESCRIPTION OF THE PREFERRED EMBODIMENTS

A tuning circuit of the present invention is constructed so as to compensate a series resistance component thereof by means of such construction that one side of a series resonance circuit having an inductor and a capacitor connected in series with each other is driven and other side thereof is earthed through a negative resistance circuit in order to keep pass band width and circuit gain constant even if a tuning frequency is changed. An output of the tuning circuit is taken out from a suitable point within the negative resistance circuit because said output is taken out from a connection point of the inductor and the capacitor as a voltage, so that the circuit gain thereof is changed by changing a tuning frequency. Its reason lies in that if a series resistance component is constant when a negative resistance circuit is used even if a tuning frequency is changed, a current flowing through the negative resistance circuit is constant.

A negative resistance circuit can be realized by means of combination of a positive feedback circuit and a negative feedback circuit. However, a negative resistance circuit in the present invention includes a circuit having a differential input in first stage thereof and a low output impedance circuit such as an emitter follower in second stage to made it operate at a high frequency band. An output of the emitter follower is directly fed back to a same phase input side of the differential input and further is fed back to an inverse phase input side thereof, so that a negative resistor can be obtained at this inverse phase input terminal.

Figure 1:
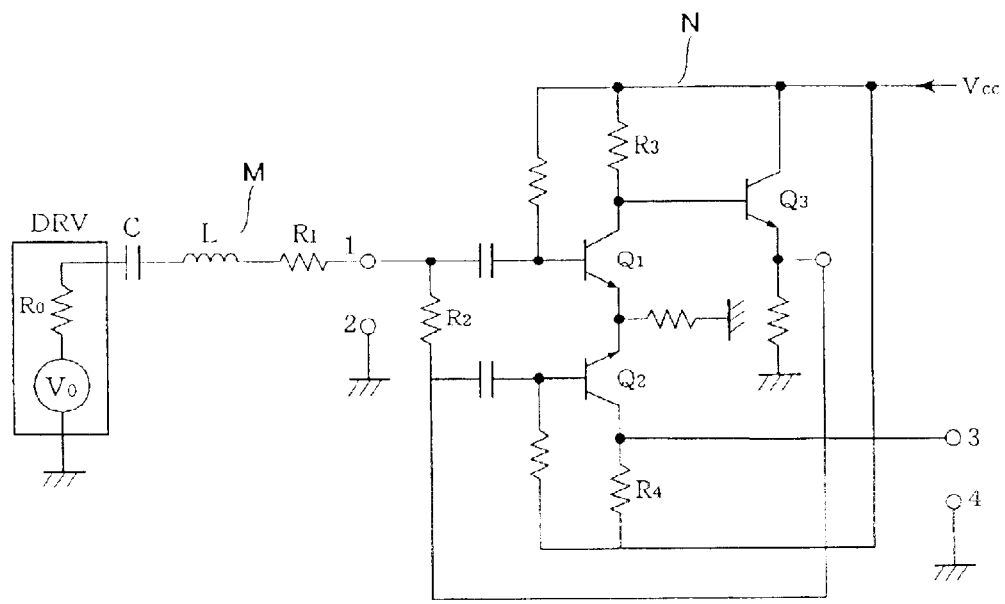
FIG. 1 is a circuit construction diagram showing an embodiment of the present invention.

FIG. 1 shows an embodiment of a tuning circuit of the present invention. Also, FIG. 2 shows an equivalent circuit for explaining operation of said embodiment.

In FIG. 1, DRV is a driving circuit of the tuning circuit, $V_0$ is a driving source voltage and $R_0$ is an inside resistor thereof. C, L, $R_1$ are a capacitor, an inductor and a series resistance component constituting a series resonance circuit M respectively, and 1, 2 is an input terminal of a negative resistance circuit N for compensating a series resistance component of $R_0$ and $R_1$.

The negative resistance circuit N is constituted by three transistor circuits. $Q_1$, $Q_2$ are transistors constituting a differential amplifying circuit. A $Q_1$ side is an inverse phase side, a $Q_2$ side is a same phase side. Also, $Q_3$ is an emitter follower circuit for providing a low output impedance and 3, 4 is an output terminal.

Figure 2:
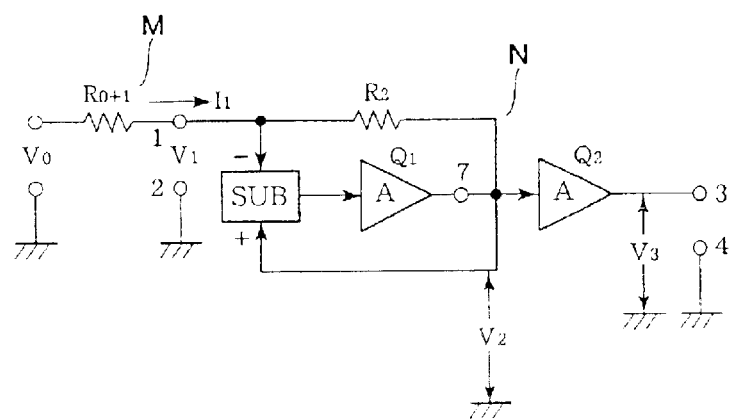
FIG. 2 is an equivalent circuit diagram for explaining operation principal of the present invention.

FIG. 2 represents blocks indicating functions of the circuit of FIG. 1. In FIG. 2, since a reactance component is zero because the circuit is in a tuning point, a resistance component of $R_1$ remains and thus $R_{0+1}$ is combination of this $R_1$ and the inside resistor $R_0$.

The negative resistance circuit N consists of a subtracting circuit SUB, the amplifying circuit $Q_1$, $Q_2$ and a negative resistance value setting resistor $R_2$ equivalently and A is an amplification factor of the amplifying circuit $Q_1$, $Q_2$ when $R_3 = R_4$.

In FIG. 2, when the right side is seen from the terminal 1-2, the following equations exist.

$$\frac{V_2 - V_1}{R_2} = 0 \tag{1}$$

$$V_2 = (V_2 - V_1)A \tag{2}$$

From this relation, the following equation is obtained.

$$\frac{V_1}{I_1} = R_2(A-1) \quad (3)$$

Thus, it can be understood that a negative resistor is connected to the terminal 1-2.

Nextly, a transfer function from the driving circuit DRV to the output terminal 3-4 is as follows.

$$\frac{V_3}{V_0} = \frac{AR_2}{\{1+(1/A)\}(R_{0+1}+R_2)-R_{0+1}} \quad (4)$$

Figure 3:
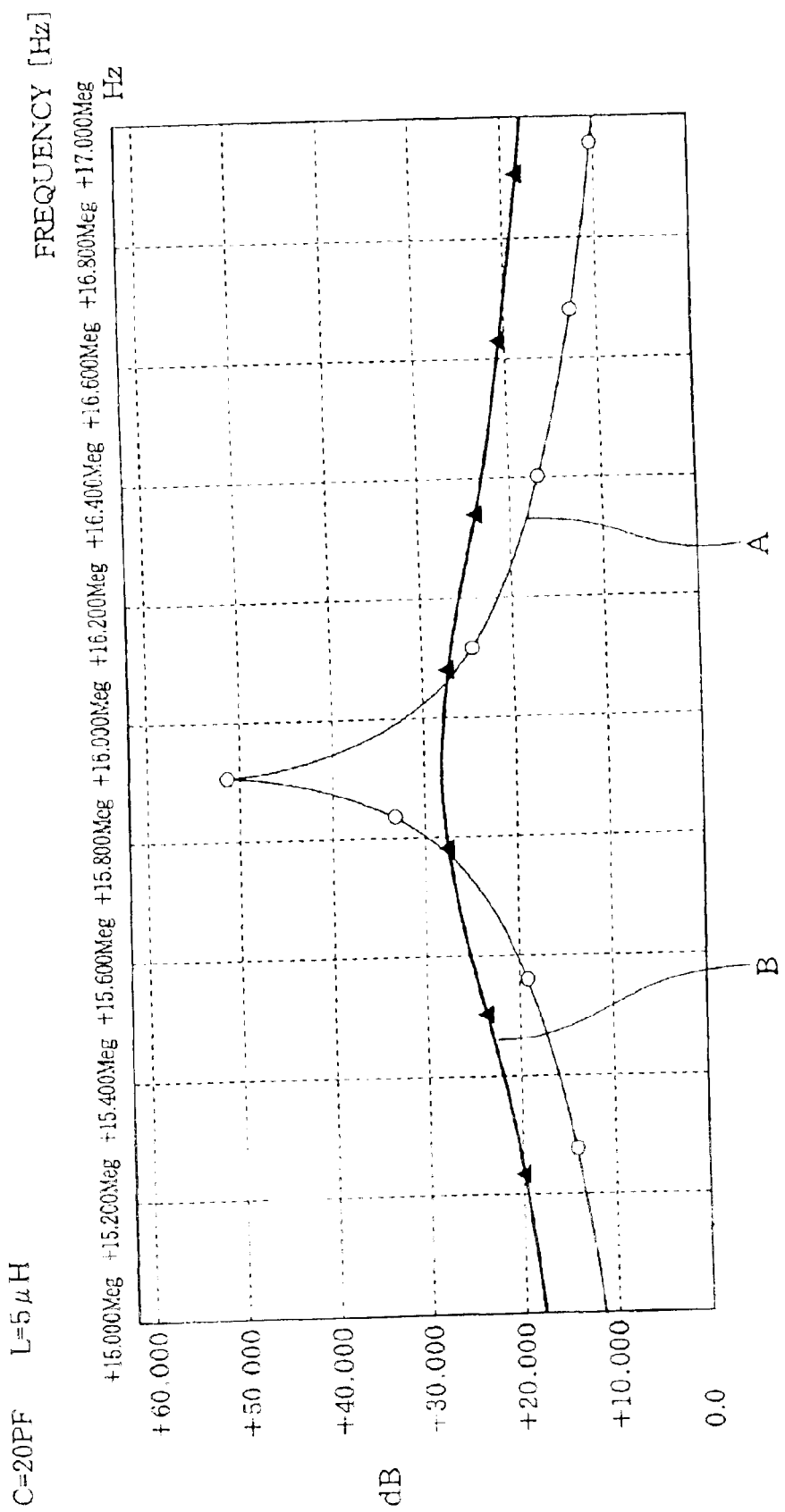
FIG. 3 is a simulation diagram showing effect of the present invention.

FIG. 3 shows simulation results of frequency selectivity characteristic A when C=20PF, L=5 μH, $R_{0+}R_{1}$=20 Ω, $R_2$=90 Ω, $R_3$=$R_4$=390 Ω in the circuit of FIG. 1 and a frequency selectivity characteristic B of an usual circuit without a negative resistance circuit for comparison.

Figure 4:
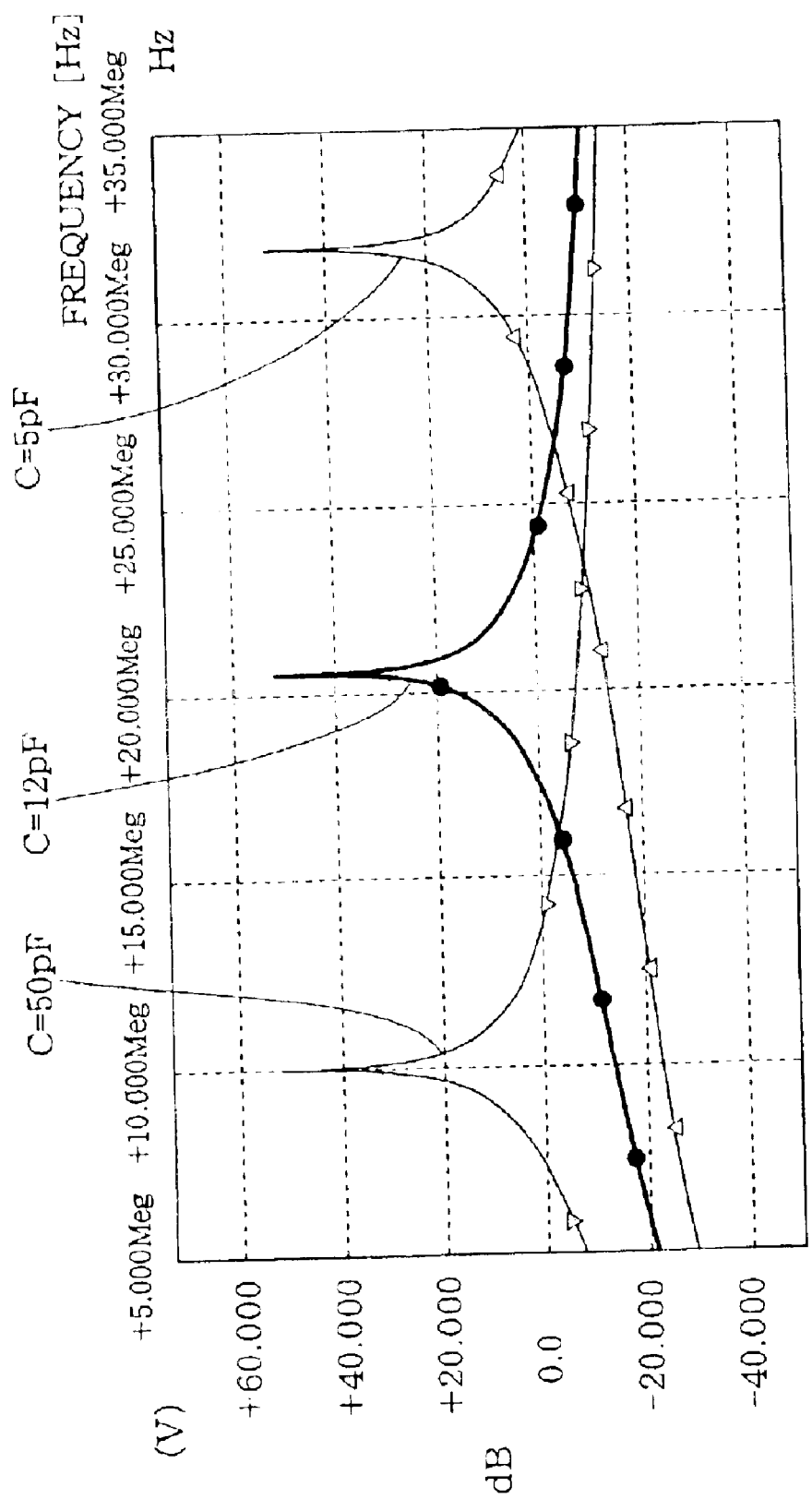
FIG. 4 is a simulation diagram showing effect of the present invention.

FIG. 4 shows simulation results of frequency selectivity characteristic when only C is changed from 5 pF to 12 pF or 50 pF. This figure teaches that in the tuning circuit of the present invention, a pass band width, that is, a frequency selectivity characteristic is constant and a tuning circuit gain is kept constant even if a capacity of the capacitor C is changed to change a tuning frequency.

As explained above in detail, according to the present invention, Q can be increased and a tuning frequency can be changed while a path band width, that is, a frequency selectivity characteristic is constant even if a capacitor C is changed to change a tuning frequency and then a tuning circuit gain is constant.

What is claimed is:

1. A tuning circuit comprising a series resonance circuit, a driving circuit connected to one side of the series resonance circuit and a negative resistance circuit connected to other side of the series resonance circuit, said negative resistance circuit consisting of a differential amplifying circuit connected to the series resonance circuit and a low output impedance circuit connected to the differential amplifying circuit, an output of the low output impedance circuit being fed back directly to a same phase input side of the differential amplifying circuit and to an inverse phase side thereof through a negative resistance value setting resistor, and a tuned output signal being taken out from a same phase output side of the differential amplifying circuit.

2. A tuning circuit according to claim 1 wherein said differential amplifying circuit includes two transistors emitters of which are connected with each other in common and the low output impedance circuit is an emitter follower circuit.

* * * * *